(12) United States Patent
Mehrotra et al.

(10) Patent No.: US 7,012,414 B1
(45) Date of Patent: Mar. 14, 2006

(54) VERTICALLY PACKAGED SWITCHED-MODE POWER CONVERTER

(75) Inventors: Vivek Mehrotra, Newbury Park, CA (US); Jian Sun, Clifton Park, NY (US); Sriram Chandrasekaran, Burbank, CA (US)

(73) Assignee: ColdWatt, Inc., Austin, TX (US)

( * ) Notice: Subject to any disclaimer, the term of this patent is extended or adjusted under 35 U.S.C. 154(b) by 0 days.

(21) Appl. No.: 10/922,062

(22) Filed: Aug. 19, 2004

(51) Int. Cl.
  *G05F 3/06* (2006.01)

(52) U.S. Cl. .................. 323/306; 336/184; 336/212

(58) Field of Classification Search ................ 323/307, 323/306, 308; 336/184, 212, 178
See application file for complete search history.

(56) References Cited

U.S. PATENT DOCUMENTS

| | | | | |
|---|---|---|---|---|
| 3,681,679 A | * | 8/1972 | Chung | 323/306 |
| 3,708,744 A | * | 1/1973 | Stephens et al. | 323/307 |
| 4,019,122 A | * | 4/1977 | Ryan | 323/307 |
| 4,075,547 A | * | 2/1978 | Wroblewski | 323/307 |
| 5,126,714 A | | 6/1992 | Johnson | |
| 5,719,544 A | * | 2/1998 | Vinciarelli et al. | 336/84 C |
| 5,784,266 A | | 7/1998 | Chen | |
| 5,999,066 A | * | 12/1999 | Saito et al. | 333/132 |
| 6,348,848 B1 | | 2/2002 | Herbert | |
| 6,362,986 B1 | | 3/2002 | Schultz et al. | |
| 6,549,436 B1 | | 4/2003 | Sun | |
| 6,696,910 B1 | * | 2/2004 | Nuytkens et al. | 336/200 |
| 2002/0114172 A1 | | 8/2002 | Webb et al. | |

OTHER PUBLICATIONS

Xu, et al., Design of 48V Voltage Regulator Modules with a Novel Integrated Magnetics, IEEE Transactions on Power Electronics, vol. 17, No. 6 (Nov. 2002), pp 990-998.

* cited by examiner

*Primary Examiner*—Bao Q. Vu
(74) *Attorney, Agent, or Firm*—Slater & Matsil, L.L.P.

(57) ABSTRACT

A vertically packaged cellular power converter solves the problems associated with conventional designs and paves the way for a cellular circuit architecture with ultra-low interconnect resistance and inductance. The vertical packaging results in a power flow in the vertical direction (from the bottom to the top) with very short internal interconnects, thereby minimizing the associated conduction losses and permitting high conversion efficiency at high currents. The cellular architecture is ideally suited for generating multiple supply voltages.

21 Claims, 7 Drawing Sheets

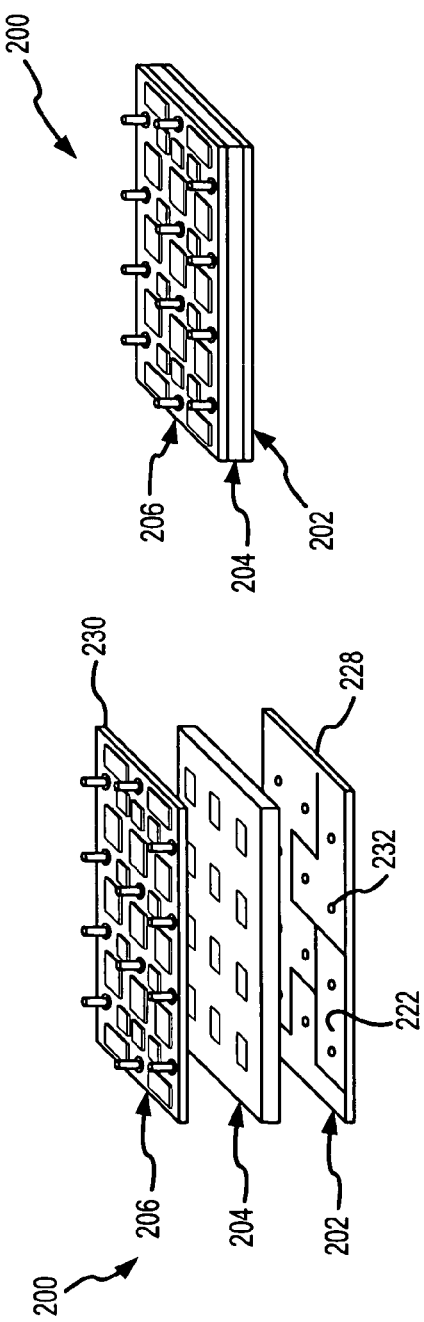
FIG.6b
FIG.6a
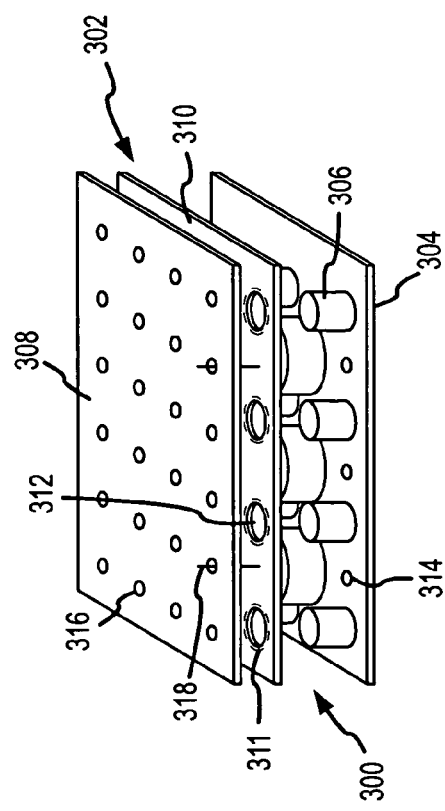
FIG.8

VERTICALLY PACKAGED SWITCHED-MODE POWER CONVERTER

BACKGROUND OF THE INVENTION

1. Field of the Invention

This invention relates to power converters and more specifically to a packaging architecture that provides for vertical power flow that is effective for providing lower supply voltages, dynamic voltage scaling, multiple supply voltages, and fast transient response and tight regulation.

2. Description of the Related Art

Power converters are key components in many military and commercial systems and they often govern size and performance. Power density, efficiency and reliability are key characteristics used to evaluate the characteristics of power converters. Transformers and inductors used within these power converters may be large and bulky and often limit their efficiency, power density and reliability. These deficiencies can be improved by using a high-frequency "switch-mode" architecture instead of a traditional low frequency transformer and by replacing conventional core-and-wire designs with "planar magnetics". Planar magnetics offer several advantages, especially for low-power dc—dc converter applications, such as low converter profile, improved power density and reliability, reduced cost due to the elimination of discrete magnetic components, and close coupling between different windings.

As shown in FIG. 1, a conventional switch-mode power converter 10 for transforming an input voltage $V_{in}$, e.g. 48V, to one or more ultra low supply voltages VS, e.g., 1.5V, 3.3V, to drive a load 12 utilizes horizontal packaging in which components are mounted on the same multi-layer printed circuit board (PCB) 14, and power flows sequentially over long interconnects from input to the output side. Moreover, multiple secondary windings and cross regulation are utilized for the generation and control of multiple supply voltages. Components such as an input filter 16, primary switches 18, a primary control IC 20, a transformer 22, secondary devices 24, a secondary control IC 26, an output inductor 28 and an output capacitor 30 are mounted on the board 14, forming what will be referred to hereafter as a "horizontal package". Arrow 32 indicates that the power flows through the different components in the horizontal direction from the input to the output and is coupled horizontally via traces on the PCB to load. Other internal layers may be used for interconnections, ground planes, or some active or passive devices in MCM-type (multi-chip module) or embedded packaging.

A popular implementation of the dc/dc switch-mode converter 10 to supply a single regulated output voltage incorporates a drive circuit 34 having a double-ended, half-bridge topology and a current-doubler rectifier (CDR) circuit 36 shown in FIG. 2 (U.S. Pat. No. 6,549,436 issued Apr. 15, 2003). Early CDR circuits used three separate magnetic components, namely, one transformer and two inductors. The illustrated CDR is based on an integrated magnetic implementation in which the transformer and inductors are combined into a single magnetic structure with one magnetic core. The integrated magnetic implementation is further refined to include an output inductor that increases the effective filtering inductance (See U.S. Pat. No. 6,549,436).

The drive circuit 34 comprises first and second input filter capacitors 40 and 42 and first and second primary switches 44 and 46, e.g. power MOSFETs. The capacitors 40 and 42 and switches 44 and 46 process power from a dc voltage source $V_{in}$ at input terminals 48 and 50. The drive circuit 34 provides a pulse width modulated voltage to the CDR's split-primary winding arrangement 52 and provides an ac voltage at the input terminals of the integrated magnetics.

The CDR circuit 36 comprises a magnetic core 54, the split-primary winding arrangement 52, a secondary winding arrangement 56, an output capacitor 58, and first and second secondary switches 59 and 60, and first and second rectifiers 61 and 62 connected in parallel across the respective switches. The switches 59 and 60 function as diodes, termed synchronous rectification, and can be replaced by diodes only. The magnetic core 54 comprises a center leg 64 and a first outer leg 66 and a second outer leg 68 disposed on opposite sides of the center leg 64. A plate 67 on the outer legs forms an air gap 69 with the center leg to prevent saturation of the core.

The split-primary winding arrangement 52 comprises a primary winding 70 that is wound around the outer leg 66 and a second primary winding 72 that is wound around the outer leg 68. The secondary winding arrangement 56 comprises first, second and third secondary windings 74, 76, 78 that are wound around legs 66, 68 and 64, respectively. The outer leg windings 74 and 76 provide both the secondary windings for the transformer and the output inductors. The center leg inductor winding 78 increases the filter inductance of the CDR circuit thereby reducing the voltage and current ripple and improving efficiency.

The inductor winding 78 is connected in series with the output capacitor 58. The output capacitor has first and second terminals 80 and 82, which form the output terminals of the integrated current-doubler rectifier 36 and the dc/dc converter circuit 10 shown in FIG. 1 for connection to the load. The secondary switch 59 and rectifier 61 are connected in parallel between the output capacitor 58 and the winding 74. The secondary switch 60 and rectifier 62 are connected in parallel between the output capacitor 58 and the winding 76.

In operation, a dc voltage is applied to the capacitors 40 and 42 and the primary switches 44 and 46 via input terminals 48 and 50. A primary control IC 84 controls the primary switches such that at most only one switch is on at a time and synthesizes a high frequency AC voltage that is applied to the primary windings 70 and 72. This causes a current to flow in the secondary windings 74, 76 and 78. A current $i_1$ flows in the switch-diode pair 59–61, a current $i_2$ flows in the switch-diode pair 60–62, and a current $i_3$ to flow in the secondary winding 78 (where $i_1+i_2=i_3$), though ordinarily not all at the same time. One of the currents $i_1$ or $i_2$ is zero during power transfer periods, while in the free wheeling periods the load current to node 80 is shared among them. A secondary control IC 86 controls secondary switches 59 and 60 so that current $i_1$ flowing through winding 74 is rectified by the switch-diode pair 59–61 and the current $i_2$ flowing through the winding 76 is rectified by the switch-diode pair 60–62. Current $i_3$ charges the output capacitor 58 to produce a DC output voltage across output nodes 80 and 82 so that a regulated power is delivered to the load. Power flows from the input terminals horizontally through the primary switches, the transformer plus inductors, secondary switches to the output terminals for connection to a load on the same board.

As shown in FIGS. 3a and 3b, the primary and secondary winding arrangements are implemented with a multi-layer printed circuit (PCB) 90 having copper traces that form the various horizontal windings in the plane of the PCB. E-core 54 is positioned underneath the PCB so that its outer legs 66 and 68 extend through holes in the PCB that coincide with the edges of primary and secondary windings 70 and 74 and 72 and 76, respectively, and its center leg 64 extends through a hole that allows inductor winding 78 to be wound around it. Required creepage distance is maintained between the windings and the core during fabrication. Plate 67 rests on the outer legs forming an air gap 69 with the center leg. Vias 92 in the PCB are used to connect the primary windings in series to form a multi-turn primary and to connect the secondary windings in parallel to form a single-turn secondary with reduced resistance. The windings are terminated in the plane of the PCB so that power flows horizontally from the primary side to the secondary side.

Among the various power reduction and power management requirements for developing systems, the needs for lower supply voltages, dynamic voltage scaling, multiple supply voltages, and fast transient response with tight regulation will have the most dramatic effects on power converter design. While each individual requirement represents a challenge for the power converter design and packaging, it is the combination of them all together that is pushing the existing power conversion technology to its limit.

The conventional horizontal package has fundamental limitations that will render it ineffective for these developing applications, including a) inherently low efficiency, especially at sub-1V output, due to the long internal interconnects and the associated high conduction losses, b) a difficult 1-D interface with the load, c) inability to supply tightly regulated multiple outputs, and (d) switching frequency limitation due to the inductive and capacitive parasitics inherent in long interconnects. The needs for coordination among multiple supply voltages, such as sequencing, also makes it difficult to use multiple, individually controlled single-output converters. In addition, conventional control design focuses on constant output regulation with steady-state load, which cannot meet the future needs for dynamic voltage scaling and fast transient responses.

SUMMARY OF THE INVENTION

The present invention provides a package design for a power converter that addresses the need for multiple, low supply voltages with tight regulation and fast transient responses.

This is accomplished with a vertical package that incorporates a magnetic core and winding arrangement that allow power to flow vertically from an input module to an output module. The vertical package provides very short internal interconnects and a 2-D interface to the load, which reduce losses and parasitics. The vertical package may be implemented with vertical winding arrangements that are inherently more efficient than conventional planar integrated magnetics. The use of a matrix integrated magnetics (MIM) core creates a cellular structure that can be used to provide multiple output voltages and/or interleaving to provide output voltages with very low ripple and faster transient response.

In a first embodiment, the MIM core can be viewed as consisting of multiple pairs of small E cores that are arranged in two dimensions in the horizontal plane to define a plurality of legs that lie in the plane and a plurality of windows through the plane. The windings are formed by patterned copper on the input and output modules on both sides of the core and conductors (pins) that extend through the core windows to connect the copper structure.

In a second embodiment, the MIM core is positioned so that its legs extend through holes in a PCB that coincide with the edges of windings formed on the PCB. The base plate and top plate are formed with vias for terminating the horizontal windings with, for example, pins and providing electrical connection to the input and output modules.

In a third embodiment, vertical windings are wound around the legs of the MIM core. The windings are extended laterally outside the core window and then turned vertically, either up or down, to extend through slits in the output or input module. The windings are terminated on winding pads on the underside of the input module and top side of the output module.

These and other features and advantages of the invention will be apparent to those skilled in the art from the following detailed description of preferred embodiments, taken together with the accompanying drawings.

BRIEF DESCRIPTION OF THE DRAWINGS

FIGS. 6a and 6b are exploded and integrated views of the input module, matrix integrated magnetics (MIM) core and output module that make up the vertical package;

FIG. 8 is an exploded view of an alternate MIM core for transferring power vertically using horizontal windings on a PCB.

DETAILED DESCRIPTION OF THE INVENTION

The present invention provides a package design for a power converter that addresses the need for multiple, dynamically scalable low supply voltages with tight regulation and fast transient responses. This is accomplished with a vertical package that incorporates a magnetic core and winding arrangement that allows power to flow vertically from an input module to an output module. The vertical package provides very short internal interconnects and a 2-D interface with the load, which reduce losses and parasitics. The vertical package may be implemented with vertical winding arrangements that are inherently more efficient than convention planar magnetics. The use of a matrix magnetics core creates a cellular structure that can be used to provide multiple output voltages and/or interleaving of currents to provide output voltages with very low ripple and faster transient response. The vertical package design can be implemented with both isolated and non-isolated CDR circuits as well as boost and buck converters.

Figure 4:
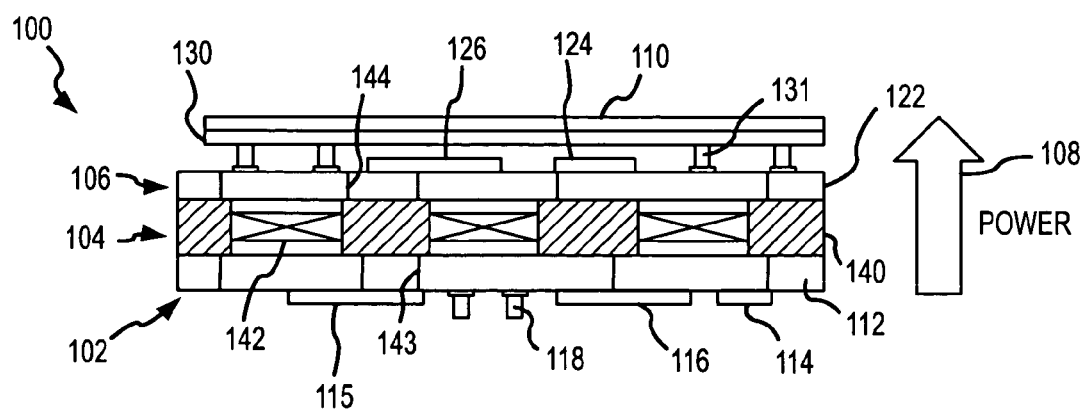
FIG. 4 is a simplified diagram of a vertical package for planar magnetic power converters in accordance with the present invention.

As shown in FIG. 4, a vertical package 100 for a switch-mode power converter includes an input module 102, a magnetic core and winding assembly 104 and an output module 106 stacked on top. As indicated by arrow 108, power is provided at the bottom of the input module and flows vertically through the package to supply power to a load 110 mounted on top of the vertical package. This configuration provides very short internal interconnects and a 2-D interface between the power converter and the load. The vertical package can be used to implement isolated and non-isolated CDR, and boost and buck converters including interleaved buck as well as other switch-mode power converters.

Input module 102 is suitably a double-sided or multi-layer printed circuit board (PCB) 112. All of the primary side circuitry including input filtering capacitors 114, primary switches 115, e.g. MOSFETS or other power devices, a primary control IC 116 and a pair of pins 118 for receiving a DC input voltage are mounted on the underside of the PCB 112. The magnetic core and winding assembly 104 is mounted on the top side of the PCB 112. Depending on the specific implementation of the magnetic core and winding assembly 104, copper traces on the top side, as well as those in the inner layers of a multi-layer PCB, may be etched to form portions of the windings or winding terminations for connection to the primary side circuitry. Vias are provided in the PCB to connect the traces on the top side and inner layers to the circuitry on the bottom side.

Output module 106 is also a double-sided or multi-layer printed circuit board (PCB) 122. All of the secondary side circuitry including secondary switches 124, e.g. MOSFETS or other power devices, a secondary control IC 126 and an array of pins 131 for supplying the output voltage are mounted on the top side of the PCB 122. The output filtering capacitors 130 can either be formed integrally with the load 110 that is mounted on an array of output pins 131 or on the top side of the PCB. For clarity, only a few output pins are shown in FIG. 4. The bottom side of PCB 122 contains secondary winding terminations and is mounted on the magnetic core and winding assembly 104. Depending on the specific implementation of the magnetic core and winding assembly 104, copper traces on the bottom side, as well as those in the inner layers of a multi-layer PCB, may be etched to form portions of the windings or winding terminations for connection to the primary and/or secondary side circuitry. Vias are provided in the PCB to connect the traces on the bottom side and inner layers to the circuitry on the top side.

The magnetic core and winding assembly 104 is the centerpiece of the vertical power converter package. The assembly processes power vertically from the input module to the output module and maintains a close coupling between the primary and secondary windings in isolated converters. In non-isolated converters, the input module is configured to provide a phase-shifted input excitation to the magnetics, which is then rectified by the switch-diode combination, to realize an interleaved converter with reduced output ripple and faster transient response. The magnetics in this case consists of interleaved coupled inductors integrated in a matrix magnetic core (matrix integrated magnetics, MIM). In isolated converters, the MIM core also provides isolation via integration of transformer and inductors into a single core. The assembly may be configured to generate a single output voltage, or multiple output voltages using a matrix integrated magnetics (MIM) core in which multiple functionally identical power converter cells can be defined. The assembly includes a magnetic core 140, windings 142, primary and/or secondary (shown schematically), primary side winding terminations 143 on the input module and secondary side winding terminations 144 on the output module.

The primary side circuitry converts the DC input voltage to a high frequency AC voltage that energizes the windings to produce currents in the windings. In the isolated case, a galvanic isolation between primary and secondary sides of the magnetics is maintained, while in the non-isolated converter, two or more inductor currents may be interleaved by creating a phase-shifted ac voltage to the magnetic assembly. The secondary side circuitry rectifies the currents to charge the output capacitor and supply a DC output voltage(s) at the output terminals. The DC output voltages can be distributed to respective pins to provide multiple supply voltages or interleaved to provide a single supply voltage with low ripple and with or without galvanic isolation from the input voltage.

The vertical package is, in particular, effective for providing lower supply voltages, dynamic voltage scaling, multiple supply voltages, fast transient response, and tight regulation at high efficiency and power density. More specifically, the short internal interconnects and 2-D interface will reduce conduction losses, which is critical to achieving sub-1V outputs at high currents. The MIM core also provides a low profile for the overall converter which is desirable in certain systems. Configuration of the preferred cellular structure in series, parallel or interleaving provides the flexibility to generate single or multiple output voltages. Lastly, the short interconnects and interleaving allows the output voltage to be dynamically changed depending on the load requirements with short transition times. This is accomplished by changing the duty cycle of the input or primary-side switches.

Figure 5:
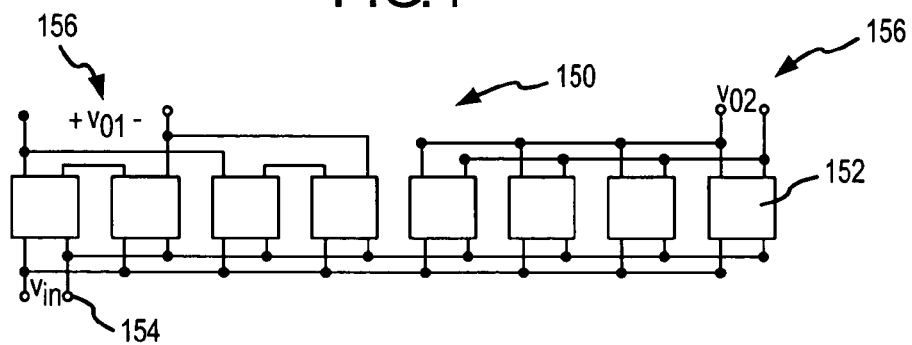
FIG. 5 is a diagram illustrating the cellular architecture of the vertical package.

As shown in FIG. 5, the cellular circuit architecture 150 refers to the use of multiple converter cells 152, all within the same package. The inputs 154 and outputs 156 of the cells are connected either in series or parallel, or a combination of both, to provide the required input and output voltage and current ratings. In the illustrated eight-cell, two-output design, the inputs are all connected in parallel to receive a single DC input voltage $v_{in}$. A single DC input is typical but not required. One group of four cells is connected to produce a first output voltage $v_{o1}$ and a second group of four cells is connected to produce a second output voltage $v_{o2}$. This is accomplished by controlling the duty cycle of the input or primary side switches. Each output can be separately regulated through the duty cycle of the respective primary side switches. Multiple output voltages that are an integer multiple of each other may also be generated by providing different turns ratios in the magnetics of the two sets of cells. In some cases, the magnetic element used for generating two or multiple sets of output voltages may require a low permeability material between the corresponding cores to control the amount of magnetic coupling between them since the load variations at one output may affect the other output(s).

Operation of the interconnected cells can also be either synchronized or interleaved. Additional benefits of the proposed cellular architecture include easy scalability to suit applications requiring different power levels, fault tolerance due to parallel operation of multiple cells, as well as fast transient response and low output voltage ripple, especially under interleaved operation, which will be further elaborated in the next section.

The cellular circuit architecture necessitates the use of multiple magnetic components such as inductors and transformers. Instead of using discrete magnetic components each built on a separate magnetic core, the proposed design uses matrix integrated magnetics (MIM) in which all magnetic components form a matrix and are constructed on a single MIM core of the type show in FIG. 4. Three different embodiments for the matrix magnetics using different MIM core structures and winding configurations are illustrated in FIGS. 6 through 9.

MIM Core and Winding Structure 1:

As shown in FIGS. 6 and 7, a vertical package 200 for a switch-mode power converter includes an input module 202, a MIM core 204 and an output module 206 stacked on top so that power flows vertically from the input module to the output module to a load.

MIM core 204 can be viewed as consisting of multiple pairs of small E cores 208 that are arranged in two dimensions in the horizontal plane to define a plurality of legs 210 that lie in the plane and a plurality of windows 212 through the plane. The basic requirements for the core material for transformer and inductor applications are high saturation field, high permeability, and low loss at high frequency. Ferrite is a mature magnetic material for high frequency applications. However, its low saturation field necessitates the insertion of air gap in the magnetic path when used for inductors, which is undesirable for the matrix structure due to its close proximity to the conductor windings. Alternately, the core can be formed with a composition of a high permeability material such as ferrite and a high saturation material such as powdered iron in place of the air gap as detailed in copending application "Composite Magnetic Core for Switch-Mode Power Converters" filed on Aug. 19, 2004. Alternative magnetic materials suitable for this application are also possible. In cases where multiple outputs are desired, the amount of magnetic coupling between the cells must be controlled. This can be accomplished by interposing a low permeability material between the integrated magnetic elements used for generating the multiple outputs.

The winding and associated interconnect designs are another key aspect of matrix magnetics critical for achieving high efficiency and high power density. In this approach, a winding 220 for a magnetic cell 221 is formed by patterned copper conductors 222 and 224 on both sides of the core, as well as conductors 226 through the core windows that connect them. The thickness and number of the conductors 226 is dependent on the current per cell and the total number of cells connected in parallel. The basic cell design can be repeated for any number of cells to form the windings for the entire matrix. The regular shape and repeating pattern of the copper conductor allows them to be constructed on the printed circuit boards (PCBs) 228 and 230 on which the input and output modules are formed. This result is very short interconnects with low resistance and inductance from input to output. The interconnections between the winding PCBs are shown to use conductors 226 and vias 232 in the PCBs. Other interconnection techniques are possible as well.

Figure 7B:
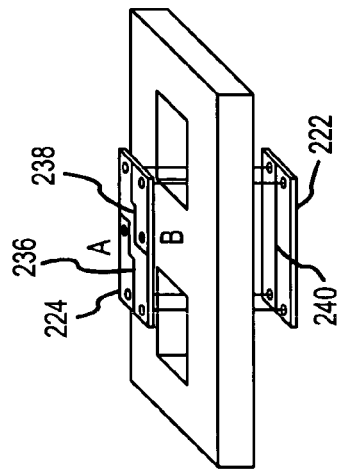
FIGS. 7a through 7d are diagrams illustrating the construction of the vertical windings in the package.
Figure 7D:
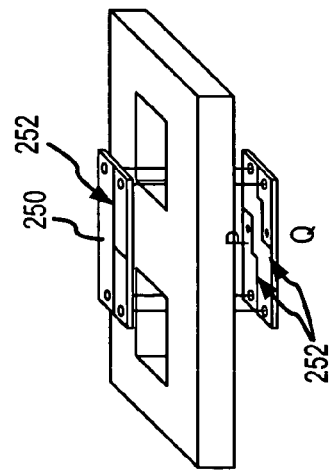
Figure 7A:
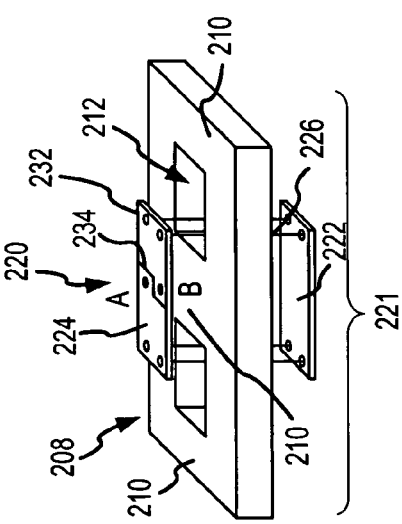
Figure 7C:
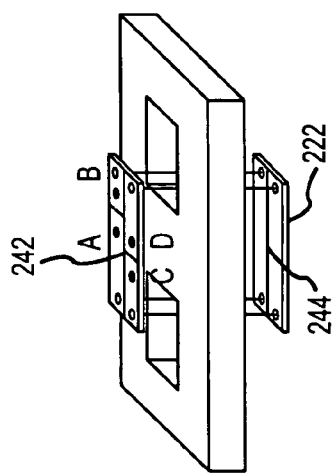

The basic winding design for forming a single turn, multiple turns and multiple windings on a single leg is shown in FIGS. 7a–7c. The PCB is not shown in this figure for clarity. As shown in FIG. 7a, a single turn between points A and B is formed by etching away an insulating region 234 in the copper conductor 224 so that A and B lie on opposite sides. Current flows from A, down pins 226, across copper conductor 222 and up pins 226 to point B. As shown in FIG. 7b, two series-connected turns between points A and B are formed by etching away first and second regions 236 and 238 of copper conductor 224 and a first region 240 of copper conductor 222. Current flows from A, down one pin 226, across the back part of conductor 222, up one pin 226, across the diagonal part of conductor 224, down one pin 226, across the front part of plate 222, up one pin 226 to point B completing the two series connected turns around leg 210.

As shown in FIG. 7c, two separate single-turn windings between points A and B and C and D are formed by etching away a region 242 of conductor 224 and a region 244 of conductor 222. Current flows from A, down pins 226, across conductor 222 and up pins 226 to point B. Current flows similarly from C to D. Any arbitrary number of windings and number of turns for a given winding can therefore be implemented using the arrangement of conductor and etched patterns. Also, as illustrated, these designs can be used as secondary side windings terminated at points on the output module. Primary side windings are similarly formed by arranging the conductor 250 and etched regions 252 and terminated at points P and Q at the input module (FIG. 7d). This arrangement allows proper separation between the primary and secondary terminations to meet voltage isolation requirements.

MIM Core and Winding Structure 2:

As shown in FIG. 8, a MIM core 300 and winding arrangement 302 that utilizes conventional planar windings formed on a multi-layer PCB can be sandwiched between the input and output modules so that power flows vertically to a load.

The MIM core 300 includes a magnetic base plate 304, a plurality of magnetic legs 306 on the base plate and a magnetic top plate 308. To prevent saturation of the core some of the legs may be gapped using conventional techniques or portion of the core in high flux areas may be formed from a magnetic material of high saturation field. The winding arrangement 302 is implemented with a multi-layer printed circuit board (PCB) 310 having copper traces that form the various horizontal windings 311 in the plane of the PCB. MIM core 300 is positioned underneath the PCB so that its legs 306 extend through holes 312 in the PCB that coincide with the edges of the windings 311 with proper creepage distances maintained between the core and the conductor. The base and top core plates or sheets are formed with vias 314 and 316, respectively, for terminating the horizontal windings 311 with, for example, conductor pins 318 with an outside insulation layer and providing electrical connection to the input and output modules. Pins for the primary side module extend out through the bottom plate 314 while those for the secondary side module extend out through the plate 316. The core plates 314 and 316 may be formed of a sheet of magnetic material.

Figure 9:
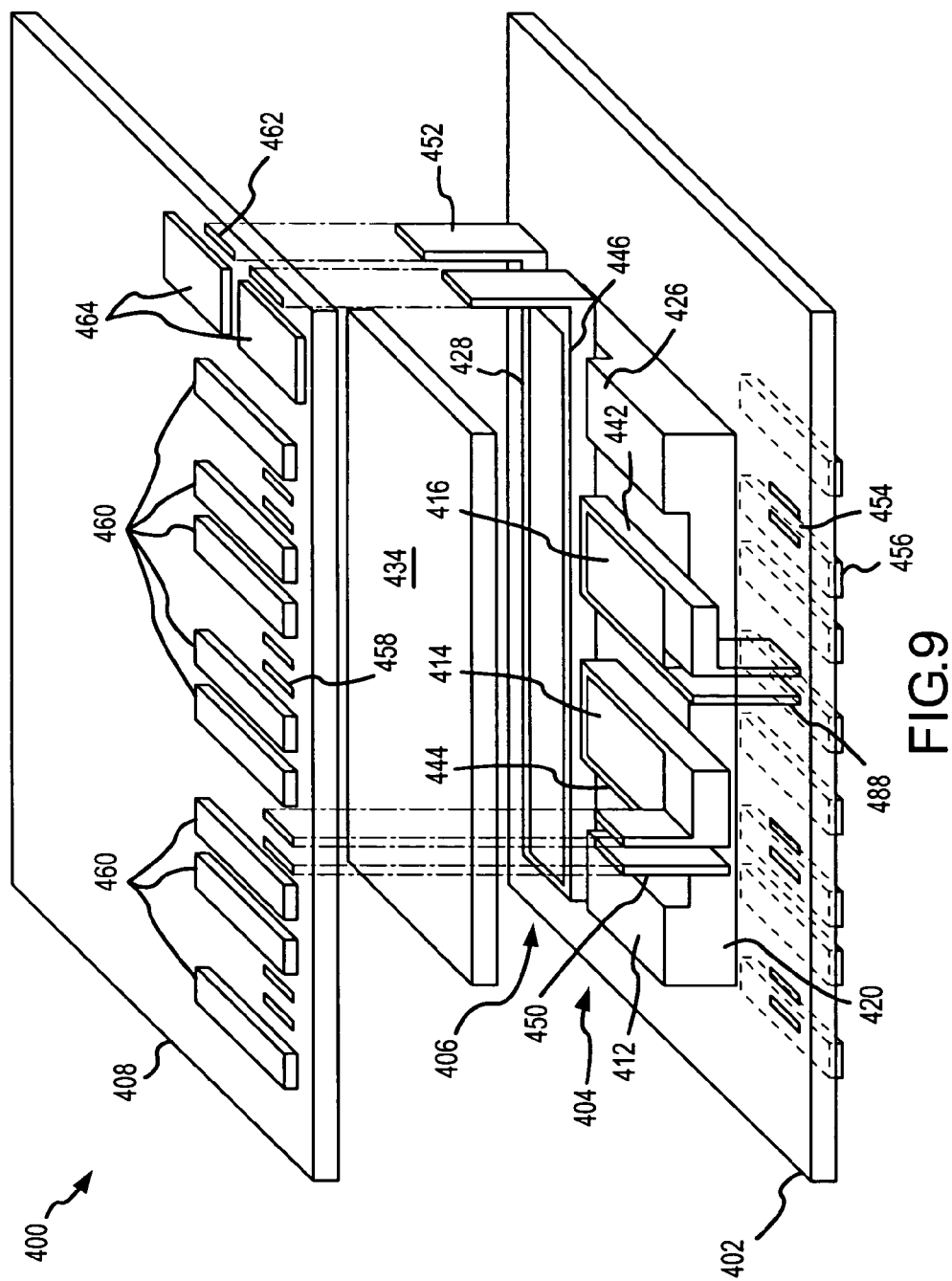
FIG. 9 is an exploded view of another MIM core with an alternate vertical winding structure.

MIM Core and Winding Structure 3:

As shown in FIG. 9, a vertical package 400 for a switch-mode power converter includes an input module 402, a MIM core 404 and winding arrangement 406 that utilizes vertical windings, and an output module 408 stacked on top so that power flows vertically from the input to output modules.

MIM core 404 includes at least first, second and third outer legs 412, 414 and 416, respectively, disposed on a base 420 and separated along a first outer edge to define first, second, etc. windows there between. A fourth outer leg 426 and window are also included in this embodiment and this construction can be used to add legs as dictated by the design. A center leg 428 is disposed on base 420 along a second outer edge and separated from the first, second and third (or more) legs to define a center window. A plate 434 is disposed on the first, second and third (or more) legs opposite the base. If the core is formed from a single high permeability material such as ferrite as is conventional, an air gap is formed between the plate 434 and center leg 428 to avoid core saturation. If a composite core comprising high permeability material for the outer legs (412, 414, 416, 426 etc.) and high saturation field material for the center leg 428 are used, no air gap is necessary. Alternately, the outer legs may also be arranged at the four corners of the base and the center leg formed in the shape of a cross and positioned at the center of the base.

Figure 1:
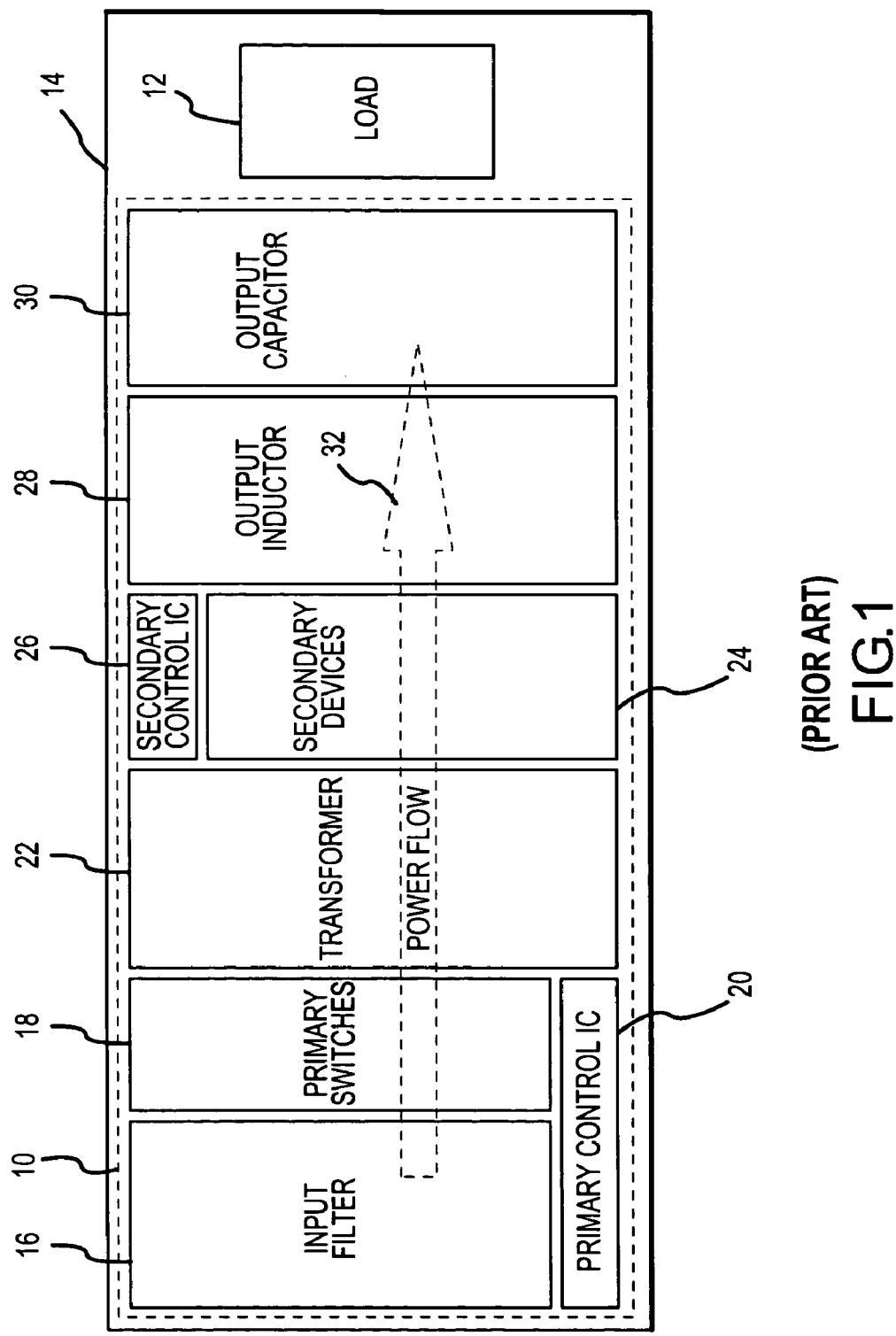
FIG. 1, as described above, is a block diagram of a conventional horizontal package for a switch-mode power converter.
Figure 2:
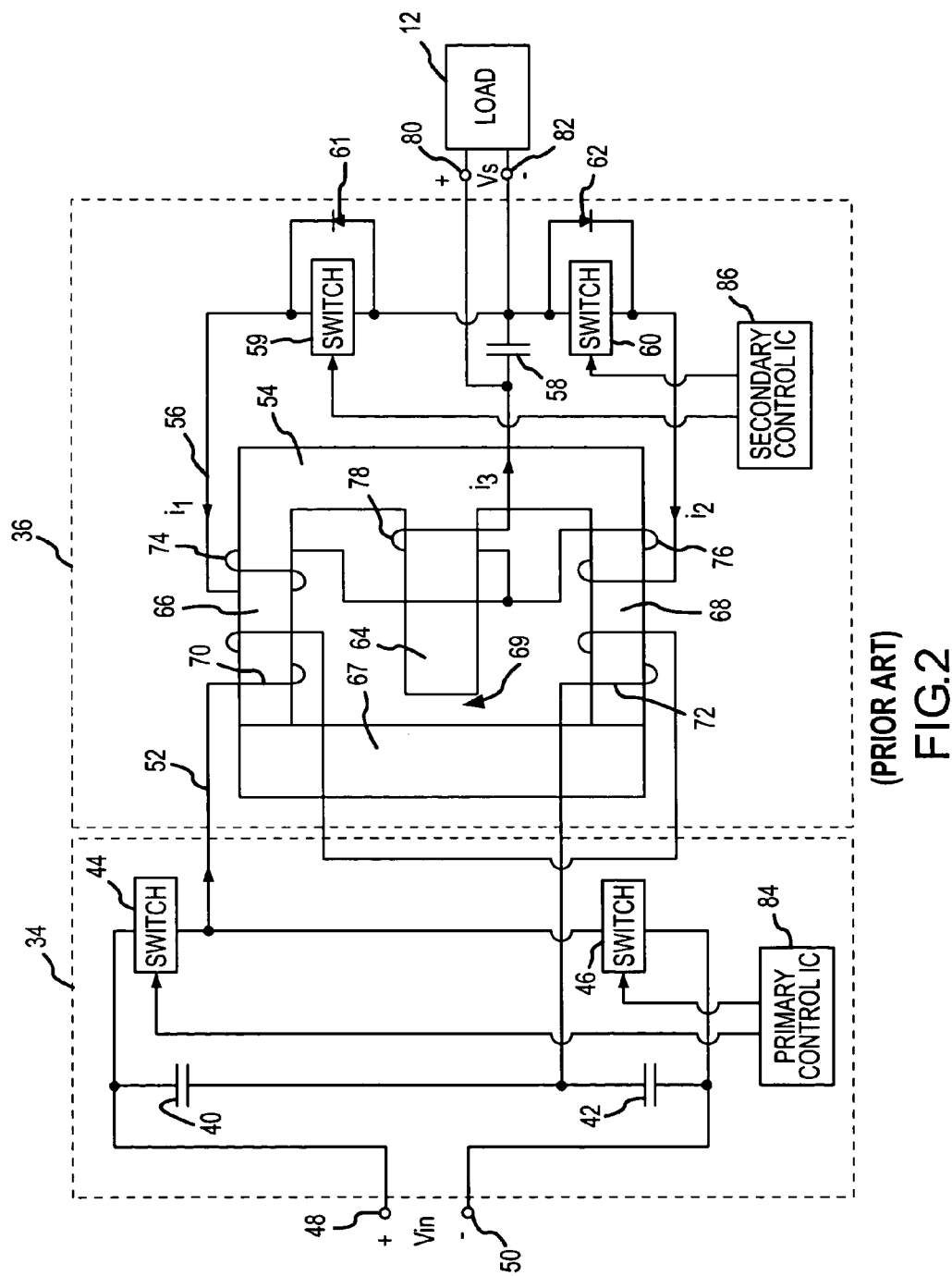
FIG. 2, as described above, is a simplified schematic diagram of a known current-doubler rectifier (CDR) circuit.
Figure 3A:
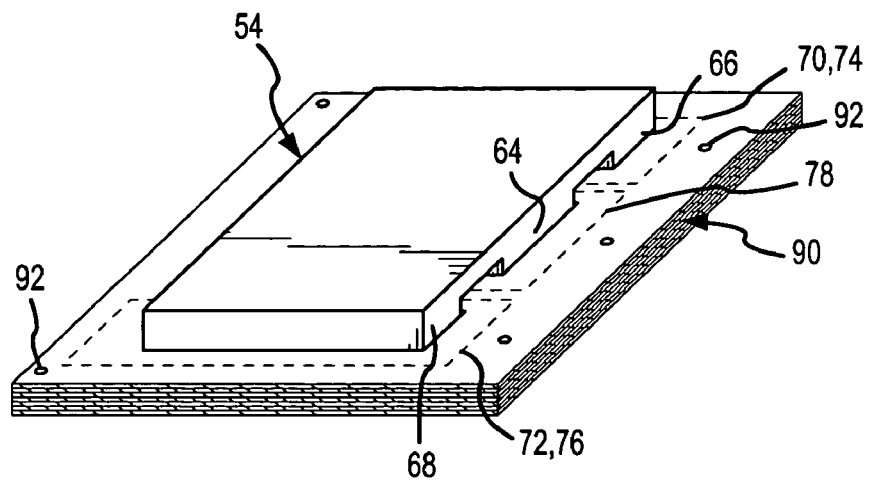
FIGS. 3a and 3b, as described above, are perspective and section views of a planar magnetics implementation of the winding structure.
Figure 3B:
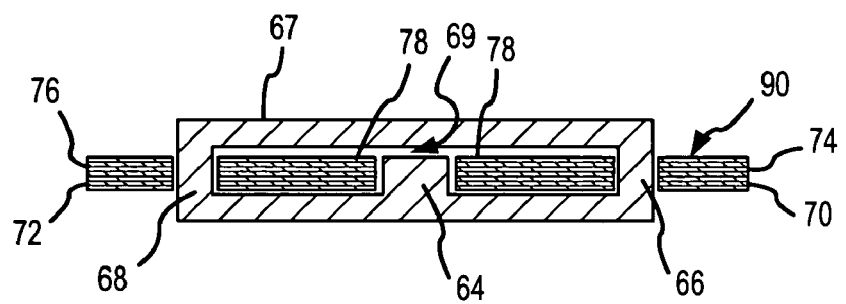

Winding arrangement 406 is implemented with vertical conductors that are wrapped around the legs orthogonal to the plane of the core and input and output modules. The vertical conductors may be formed from, for example, a copper foil insulated on the outside, which provides electrical isolation between the windings and core, as well as between the windings themselves. The insulation is removed at the terminations to provide an electrical contact to copper pads made on PCB 408 and 402. In the example shown in FIG. 9, the winding arrangement provides a split-primary winding, secondary windings and an additional inductor winding around the center leg 428. The windings are made in accordance with FIG. 2 (U.S. Pat. No. 6,549,436). For clarity only a two-turn primary winding is shown in leg 416 while a single turn secondary is shown in leg 414. Outer leg 416 is wound with two turns of an insulated copper foil 442 to form one side of the two-turn split-primary winding.

Outer leg 414 is wound with a single turn of copper foil 444 to form one side of the single-turn secondary. The split primary and secondary windings shown are repeated on each of the legs 412, 414, 416 and 426 in accordance with the arrangement in FIG. 2 and a co-pending application "Extended E Matrix Integrated Magnetics (MIM) Core" filed on Aug. 19, 2004. The primary turns are serially connected while the secondary turns may be parallel connected for a single turn. Following the same method and arranging the terminations can be used to achieve larger number of turns for primary or secondary windings. Center leg 428 is wound with a single turn of copper foil 446 to form the single turn inductor winding.

To avoid the formation of vias in the magnetic core in this illustration, the copper foils 442, 444 and 446 are extended laterally outside the core window and turned vertically to form winding terminations 448, 450 and 452, respectively. The primary winding termination 448 extends down through slots 454 in the input module 402 and is turned laterally to terminate on the primary winding pads 456 on the underside of the input module. The secondary winding termination 450 extends up through slots 458 in the output module 408 and is also turned laterally to terminate on secondary winding pads 460 on the top side of the output module. Similarly, the inductor winding 452 on the center leg extends through slots 462 in the output module 408 and is terminated on center leg pads 464 on the top side of the output module. This arrangement provides voltage isolation between the primary and secondary sides.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A switched-mode power converter, comprising:
  an input module having an input interconnect for receiving a DC input voltage and a switch circuit for converting the DC input voltage to an AC voltage, said input interconnect and switch circuit being mounted on the module's bottom surface;
  a matrix integrated magnetics (MIM) core on top of the input module, said MIM core having a plurality of legs;
  a plurality of windings around the legs, at least some of said windings being energized by said AC voltage causing currents to flow in the windings; and
  an output module on top of the MIM core, said output module having a rectifier circuit that rectifies said currents to charge an output capacitor to supply a DC output voltage at an output interconnect on the module's top surface,
  wherein power flows vertically from the input interconnect on the bottom of said input module to the output interconnect on the top of said output module.

2. The power converter of claim 1, wherein said output capacitor forms a 2-D interface with a load to transfer power to the load.

3. The power converter of claim 1, wherein the DC output voltage is less than 1v.

4. The power converter of claim 1, wherein said input and output modules each comprise a printed circuit board (PCB).

5. The power converter of claim 1, wherein the windings and said core define a plurality of converter cells that convert the DC input voltage into a respective plurality of DC output voltages.

6. The power converter of claim 5, wherein the MIM core comprises a high permeability material in the converters cells and a low permeability material between the cells that regulates the magnetic coupling between the cells.

7. The power converter of claim 5, wherein a plurality of output capacitors is charged by interleaving their respective currents to supply the DC output voltage.

8. The power converter of claim 1, wherein the core comprises a plurality of windows that separate the legs, each said winding comprising:
  a pair of planar conductors, one conductor on a top surface of the input module beneath a leg and the other conductor on a bottom surface of the output module above the leg, one of said pair having points A and B that lie on opposite sides of an insulating region;
  at least one first vertical conductor connecting the pair of planar conductors through the window on one side of the leg; and
  at least one second vertical conductor connecting the pair of planar conductors through the window on the other side of the leg to form the winding between points A and B.

9. The power converter of claim 8, wherein an N turn winding comprises:
  N insulating regions on the one planar conductor that separate points A and B and form N−1 additional paths across the conductor;
  N−1 insulating regions on the other planar conductor that form N paths across the conductor; and
  N first and N second vertical conductors that connect point A on the planar conductor to a first path on the other conductor, connect said first path to a first path on the planar conductor and so forth until the Nth second vertical conduct connects the N−1 path on the other conductor to point B on the planar conductor to form the N turn winding between points A and B.

10. The power converter of claim 8, wherein N separate windings on one leg, comprise:
  N insulating regions on the one planar conductor that separate the conductor into N paths across the conductor and separate points A and B on each said path;
  N−1 insulating regions on the other planar conductor that form N paths across the conductor;

N first vertical conductors that connect the N paths on the one planar conductor to the respective N paths on the other planar conductor on one side of the leg;

N second vertical conductors that connect the N paths on the one planar conductor to the respective N paths on the other planar conductor on the other side of the leg to form N separate windings between points A and B in each said winding.

11. The power converter of claim 8, wherein the input and/or output modules comprise vias for connecting winding points A and B to the switch circuit on the bottom side of the input module and the rectifier circuit on the top side of the output module.

12. The power converter of claim 8, wherein the MIM core comprises multiple pairs of E-cores that are arranged in two dimensions in the horizontal plane to define the plurality of legs that lie in the plane and the plurality of windows through the plane.

13. The power converter of claim 1, wherein the windings comprise conductors that are formed in the plane of a multi-layer printed circuit board (PCB), said MIM core being positioned underneath the PCB so that its legs extend through holes in the PCB that coincide with the interior edges of the windings, said MIM core further comprising a base plate and a top plate having insulated vias for terminating the conductors.

14. The power converter of claim 1, wherein the MIM core comprises a base that supports said plurality of legs and a plate that rests on at least some of said legs, said windings comprising vertical conductors that are wrapped around the legs orthogonal to the plane of the core and input and output modules.

15. The power converter of claim 14, wherein the windings extend laterally outside the core window and turn up and down for termination on said output and input modules, respectively.

16. The power converter of claim 15, wherein the input module comprises a plurality of winding pads on its bottom surface and a plurality of slots through which the windings extend for termination on the respective winding pads and said output module comprises a plurality of winding pads on its top surface and a plurality of slots through which the windings extend for termination on the respective winding pads.

17. A power converter, comprising:
an input module having a plurality of first planar conductors on a top surface and an input interconnect on a bottom surface for receiving a DC input voltage and a switch circuit for converting the DC input voltage to an AC voltage;
a matrix integrated magnetics (MIM) core on the top surface of the input module, said MIM core having a plurality of windows formed therein that define a plurality of legs over the respective first conductors;
an output module on the MIM core, said output module having a plurality of second planar conductors formed on a bottom surface over the respective legs and a rectifier circuit, output capacitor and an output interconnect on a top surface; and
a plurality of first and second vertical conductors that connect the first and second planar conductors through the windows on either side of the legs, one of said first and second planar conductors having points A and B that lie on opposite sides of an insulating region to form a windings there between,
said rectifier circuit rectifying currents in said windings caused by the application of said AC voltage to charge the output capacitor and supply a DC output voltage at the output interconnect.

18. The power converter of claim 17, wherein an N turn winding comprises:
N insulating regions on the one planar conductor that separate points A and B and form N−1 additional paths across the conductor;
N−1 insulating regions on the other planar conductor that form N paths across the conductor; and
N first and N second vertical conductors that connect point A on the planar conductor to a first path on the other conductor, connect said first path to a first path on the planar conductor and so forth until the Nth second vertical conduct connects the N−1 path on the other conductor to point B on the planar conductor to form the N turn winding between points A and B.

19. The power converter of claim 17, wherein N separate windings on one leg, comprise:
N insulating regions on the one planar conductor that separate the conductor into N paths across the conductor and separate points A and B on each said path;
N−1 insulating regions on the other planar conductor that form N paths across the conductor;
N first vertical conductors that connect the N paths on the one planar conductor to the respective N paths on the other planar conductor on one side of the leg;
N second vertical conductors that connect the N paths on the one planar conductor to the respective N paths on the other planar conductor on the other side of the leg to form N separate windings between points A and B in each said winding.

20. The power converter of claim 17, wherein the input and/or output modules comprise vias for connecting winding points A and B to the switch circuit on the bottom side of the input module and the rectifier circuit on the top side of the output module.

21. The power converter of claim 17, wherein the MIM core comprises multiple pairs of E-cores that are arranged in two dimensions in the horizontal plane to define the plurality of legs that lie in the plane and the plurality of windows through the plane.

* * * * *